(12) United States Patent
Bushman et al.

(10) Patent No.: US 6,709,797 B1
(45) Date of Patent: Mar. 23, 2004

(54) METHOD AND APPARATUS FOR CONTROLLING FOCUS BASED ON A THICKNESS OF A LAYER OF PHOTORESIST

(75) Inventors: Scott Bushman, Richardson, TX (US); Anastasia Lynn Oshelski Peterson, Austin, TX (US); Edward Christopher Stewart, Buda, TX (US); Curtis Warren Doss, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 117 days.

(21) Appl. No.: 09/851,900

(22) Filed: May 9, 2001

(51) Int. Cl.[7] .................................................. G03F 9/00
(52) U.S. Cl. ........................................................ 430/30
(58) Field of Search ............................................ 430/30

(56) References Cited

U.S. PATENT DOCUMENTS 5,362,585 A * 11/1994 Adams ........................ 430/30

* cited by examiner

*Primary Examiner*—Christopher G. Young
(74) *Attorney, Agent, or Firm*—Williams, Morgan & Amerson

(57) ABSTRACT

In one illustrative embodiment, a method is provided that controls a stepper to position a focal plane of a light source adjacent a top surface of a layer of photoresist. A metrology tool is used to measure a thickness of the layer of photoresist, and a controller uses the thickness measurement to determine a position of the top surface of the layer of photoresist. The controller delivers a control signal to the stepper, causing the stepper to move the focal plane of the light source adjacent the top surface of the layer of photoresist.

11 Claims, 4 Drawing Sheets

METHOD AND APPARATUS FOR CONTROLLING FOCUS BASED ON A THICKNESS OF A LAYER OF PHOTORESIST

BACKGROUND OF THE INVENTION

1. Field of the Invention

The present invention is generally related to the field of semiconductor processing, and, more particularly, to a method of controlling positioning of a focal plane of an exposure tool relative to a surface of a semiconductor.

2. Description of the Related Art

In general, semiconductor devices are manufactured by forming many process layers comprised of various materials above a semiconducting substrate, and, thereafter, removing selected portions of the layers, i.e., patterning the layers. This patterning may be accomplished using known photolithography and etching processes to define the various features of the device, e.g., the gate insulation layer, the gate electrode, sidewall spacers, metal lines and contacts, etc. This forming and patterning of the process layers is typically performed layer by layer as the individual layers are formed, although multiple layers may be patterned at any given time.

Photolithography is a common process used in patterning these various layers. Photolithography typically involves the use of a product known as photoresist. In general terms, photoresist is a product that may be changed from a relatively soluble state to a relatively insoluble state by exposure to a light source. There are positive and negative photoresist currently available on the market.

In general, the photolithography process involves forming a layer of photoresist above a previously formed process layer, and exposing selected portions of the layer of photoresist to a light source to form a pattern in the photoresist that is desired to be formed in the under-lying process layer. All of these steps are typically performed in well-known photolithography modules that include a section for depositing the photoresist on the wafer, e.g., a spin-coating station, a device for selectively exposing portions of the photoresist layer to a light source through a reticle, e.g., a stepper, and a section for rinsing and developing the photoresist layer after it has been selectively exposed to the light source. Thereafter, an etching process, such as a plasma etching process, is performed to remove portions of the underlying process layer that are not covered by the patterned layer of photoresist, i.e., the patterned layer of photoresist acts as a mask. After the etching process is complete, the patterned photoresist layer is removed so that additional process layers may be formed above the now patterned process layer.

The purpose of the photoresist application step is to form a thin, uniform, defect-free film of photoresist above the substrate surface. A typical layer of photoresist may have a thickness varying from approximately 1500–15,000 Å, and it usually is required to have a uniformity of ±100 Å. Even this permissible variation may have undesirable effects. That is, when the photoresist is exposed to the light source, the light is generally focused at a preselected location above the substrate, which during ideal operating conditions coincides with the top surface of the layer of photoresist. However, where the photoresist is thicker or thinner than desired or anticipated, then the focal plane of the light source falls below or above the surface of the photoresist, respectively. Thus, the patterns or features formed in the layer of photoresist may not be as precise as would otherwise occur Moreover, variations in the thickness of process layers underyling the layer of photoresist may also cause the top surface of the photresist to not coincide with the focal plane of the light source. Thus, the light source may be slightly out of focus, which reduces the precision with which the pattern may be formed in the photoresist. Reduced precision in forming the pattern in the photoresist may produce semiconductor devices that have a variety of undesirable characteristics, such as increased leakage currents, increased capacitance, or in the worst case may render the device inoperable.

The present invention is directed to a method of solving or at least reducing some or all of the aforementioned problems.

SUMMARY OF THE INVENTION

In one illustrative embodiment, the present invention is directed to a method comprised of forming a layer of photoresist above a process layer formed above a semiconducting substrate. Thereafter, a position of a top surface of the layer of photoresist is determined, and a focal plane of a light source is positioned adjacent the determined position of the top surface of the layer of photoresist. Subsequently, the light source is energized.

In another embodiment of the instant invention, a system comprises a metrology tool, a controller, and a stepper. The metrology tool senses a thickness of a first layer of photoresist formed above a first semiconducting substrate. The controller determines a position of a top surface of the layer of photoresist based upon the sensed thickness of the layer of photoresist, and is capable of delivering a control signal indicating the position of the top surface of the layer of photoresist. The stepper is capable of moving one of a light source and the substrate to position a focal plane of the light source at about the determined position of the top surface of the layer of photoresist in response to receiving the control signal.

BRIEF DESCRIPTION OF THE DRAWINGS

The invention may be understood by reference to the following description taken in conjunction with the accompanying drawings, in which like reference numerals identify like elements, and in which.

Figure 1:
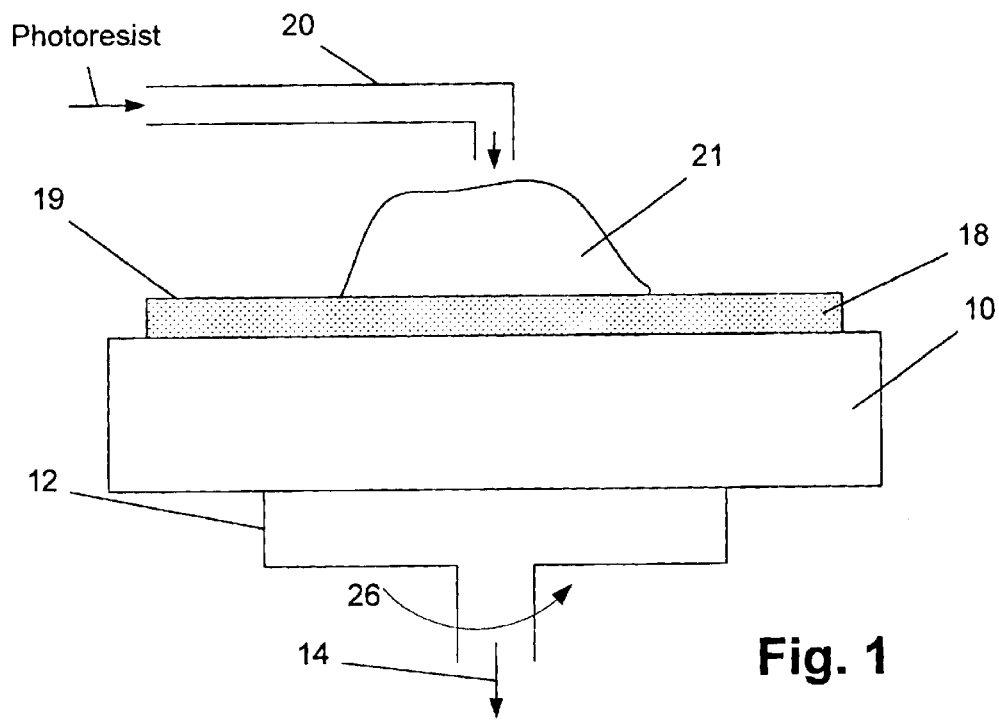
FIG. 1 is a cross-sectional view of a process whereby a quantity of photoresist is positioned on a previously formed process layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–4. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of controlling a stepper to control the focal plane of a light source used to form patterns in a layer of photoresist. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
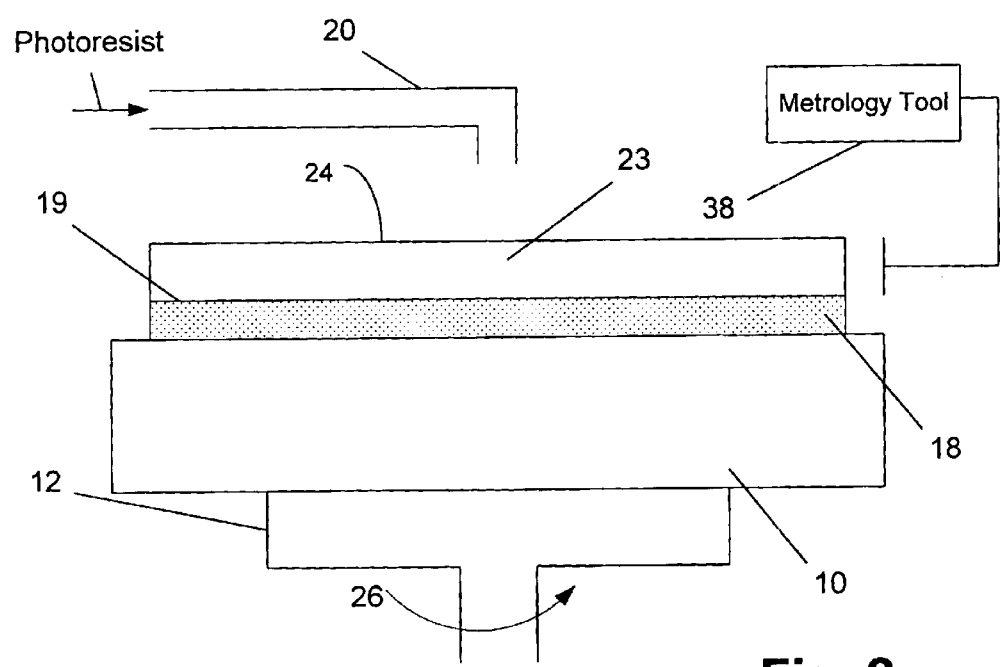
FIG. 2 is a cross-sectional view of a layer of photoresist formed by a spin-coating process.

As shown in FIG. 1, a wafer or semiconducting substrate 10 having a process layer 18 formed thereabove is positioned on a rotational element, such as a vacuum chuck 12. A vacuum may be applied, as indicated by arrow 14, to secure the substrate 10 to the vacuum chuck 12. The vacuum chuck 12 and the substrate 10 are capable of being rotated in the direction indicated by arrow 26. Photoresist from a source (not shown) is applied on the process layer 18 via a dispenser arm 20. As shown in FIG. 1, a puddle of photoresist 21 is formed above the process layer 18. The substrate 10 may or may not be rotating at the time the puddle of photoresist 21 is deposited on the process layer 18. Thereafter, as shown in FIG. 2, the substrate 10 is rotated such that the photoresist material is spread across a surface 19 of the process layer 18, forming a layer of photoresist 23 above the surface 19 of the process layer 18.

As will be recognized by those skilled in the art, the process layer 18 is meant to be illustrative only in that it may be comprised of any of a variety of materials, and there may be one or more intervening process layers between the process layer 18 and the substrate 10. For example, the process layer 18 may be comprised of an oxide, an oxynitride, a nitride, silicon dioxide, silicon nitride, a metal, polycrystalline silicon ("polysilicon"), or any other of a variety of materials used in semiconductor processing that may be patterned using photo-lithographic techniques. Moreover, the photoresist used with the present invention may be either a positive or negative type photoresist.

In the disclosed embodiment, the layer of photoresist 23 is formed by a spin-coating process. In many modern fabrication facilities, a spin-coaling process involving a moving dispenser arm 20 is used to form layers of photoresist. In that process, the substrate 10 is rotated at a relatively low speed prior to the deposition of any photoresist material 21 on the process layer 18. As the photoresist material 21 is deposited on the substrate 10, the dispenser arm 20 moves in a more or less radially outward fashion, beginning at the center of the substrate 10 and moving outward. This technique is used to more evenly distribute the photoresist across the surface 19 of the process layer 18.

Of course, as will be apparent to those skilled in the art upon reading the present application, the present invention is not limited to this particular spin-coating technique. For example, the present invention may also be used in processing techniques in which the dispenser arm 20 remains at the approximate center of the substrate 10. In that situation, the substrate 10 is initially rotated at a relatively low speed and photoresist material 21 is dispensed on the approximate center of the process layer 18. At that time, the rotational speed of the substrate is increased to disperse the photoresist. In yet another alternative embodiment, a static-type spin-coating process may be used in which the photoresist material 21 is deposited in the approximate center of a process layer 18 while the process layer 18, i.e., wafer 10, is stationary. Thereafter, the substrate 10 is rotated to disperse the photoresist evenly across the surface 19 of the process layer 18. If desired or required, a separate primer coating process may also be used prior to applying the photoresist above the process layer 18 in any of the above-described spin-coating methods.

In general, the present invention is directed to sensing the thickness of a layer of photoresist formed above a wafer, providing that sensed thickness to a controller, and using that sensed thickness for properly positioning the wafer within the stepper. That is, the position of the wafer 10 relative to the light source is controlled to locate the focal plane of the light source in a region generally coinciding with a top surface 24 of the layer of photoresist 23. For example, if the determined thickness of the layer of photoresist 23 is less than desired, the wafer 10 may be moved in closer proximity to the light source so that the focal plane falls generally near the surface 24 of the layer of photoresist 23. Conversely, if the layer of photoresist 23 is thicker than desired, the wafer 10 may be moved further from the light source so that the focal plane falls generally near the surface 24 of the layer of photoresist 23. It should be appreciated that the thickness of any underlying layer(s) may also impact the desired positioning of the focal plane of the light source. Further, even the thickness of the substrate 10 may be taken into account when deriving the desired position of the focal plane of the light source.

Figure 3:
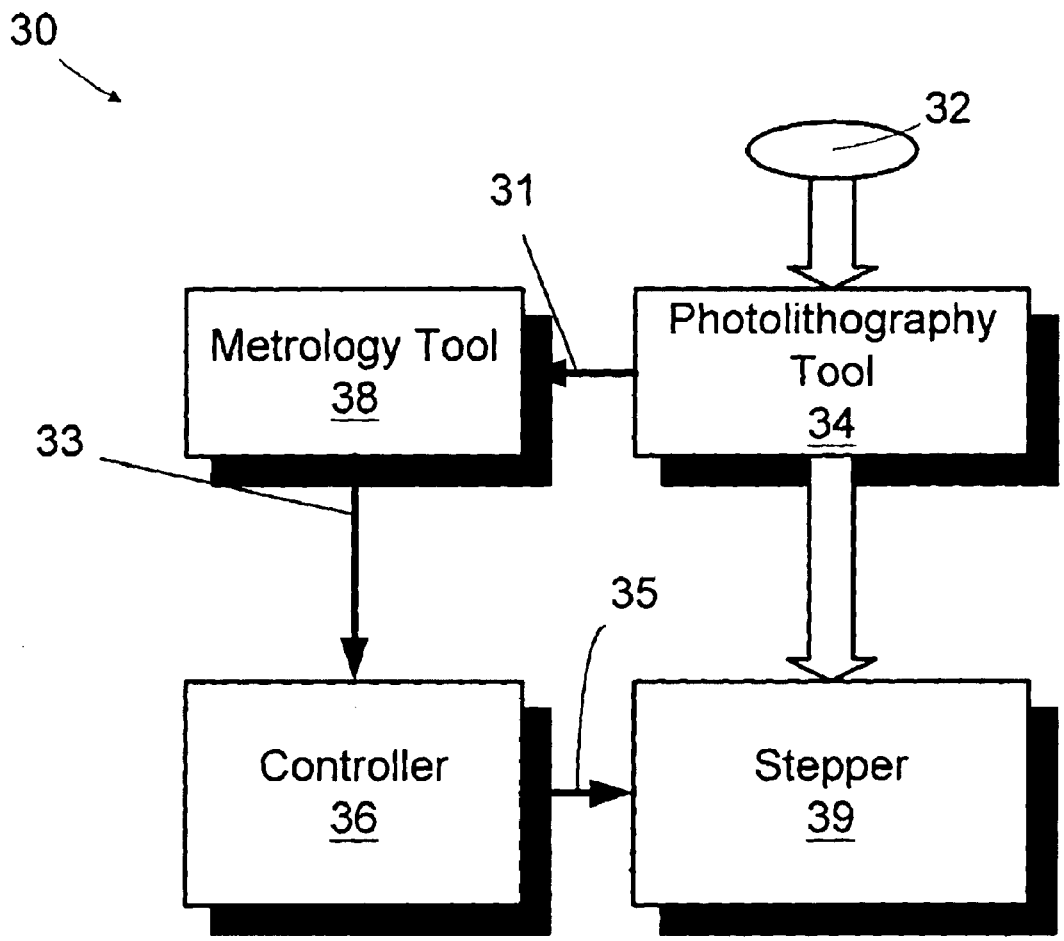
FIG. 3 depicts one illustrative embodiment of a system that may be employed with the present invention.

FIG. 3 depicts one illustrative embodiment of a system 30 that may be used with the present invention. As shown therein, a system 30 for processing wafers 32 is comprised of a photolithography tool 34, used for forming the layer of photoresist 23, a metrology tool 38, an automatic process controller 36, and a stepper 39 for controllably exposing the layer of photoresist 23 to a light source. The metrology tool 38 is used to measure or sense the thickness of the layer of photoresist 23 that is applied by the photolithography tool 34. The metrology tool 38 may also be used to measure or sense the thickness of any underlying layers 18 and even the thickness of the substrate 10. It should be appreciated that the thickness measurements may be made in a single metrology tool at one time, either serially or collectively, or may be made by a series of metrology tools that are arranged to measure some or all of the layers 10, 18, 23 as they are completed. Measurements made over a period of time may be stored for later retrieval when needed to calculate the desired position of the focal plane of the light source.

The metrology tool 38 may be any type of device capable of measuring the thickness of the layer of photoresist 23, the underlying layers 18, and/or the substrate 10, e.g., a K-T UV1050 manufactured by KLA-Tencor. Moreover, the metrology tool 38 may be a standalone device or system, or it may be incorporated into the photolithography tool 34, or a system containing both. The photolithography tool 34 is used to form the layer of photoresist 23 above the process layer 18. The photolithography tool 34 may be any tool useful for forming such layers of photoresist, e.g., TEL Act 8, DNS track system.

In one embodiment, the automatic process controller 36 interfaces with the metrology tool 38 and stepper 39 to control, determine or vary the position of the light source relative to the wafer 10. In particular, the thickness of the layer of photoresist 23 is sensed by the metrology tool 38, via line 31, and that information is supplied to the controller 36, via line 33. Thereafter, the controller 36 determines, controls and/or varies the position of the light source relative to the wafer 10 via a line 35 coupled to the stepper 39.

The stepper 39 may be any of a wide variety of devices used to expose the layer of photoresist 23 to a light source, e.g., a stepper manufactured by ASML. Generally, the stepper 39 includes a tray (not shown) positioned below a light source (not shown). The tray holds the wafer 10 and is controllably movable along x, y, and z axes. Movement of the tray along the z-axis, under control of the controller 36, allows the wafer 10 to be positioned with the top surface of the layer of photoresist 23 being positioned at about the focal plane of the light source. It should be appreciated that in other embodiments of the stepper 39, the surface 24 of the layer of photoresist 23 may be placed at about the focal plane of the light source by relocating the light source along the vertical z-axis, rather than moving the tray. That is, the relative positioning of the surface 24 of the layer of photoresist 23 relative to the light source of the stepper may be accomplished by moving the wafer, by moving the light source, or by moving both. Alternatively, other adjustments to the stepper 39 may accomplish the positioning of the focal plane of the light source, such as varying parameters of an optical system that forms part of the light source. For example, the focal length of a lens (not shown) used as part of the optical system may be varied under control of the controller 36 without departing from the spirit and scope of the instant invention.

The present invention may be employed on a lot-by-lot basis and/or on a wafer-by-wafer basis. In general, the more frequent the measurements, the more accurate will be the positioning of the focal plane on the surface of the layer of photoresist. That is, each wafer need not be measured, but rather, the measurements of a previously measured wafer may be used. The number of wafers processed between measurements is a matter of design discretion, which depends substantially on the details of the particular embodiment.

Additionally, the number of measurements taken of each layer may be varied depending upon the desired degree of accuracy. That is, a large number of measurements may be made to determine the thickness of each layer at a variety of locations. This large number of thickness measurements may be averaged, weighted, or fit to a "best plane" according to a least-squares method. A larger number of measurements may enhance the overall accuracy of the system by better accounting for local variations in the thickness of the layer. Alternatively, in some embodiments a single measurement, or relatively few measurements, may be used to arrive at the location of the desired focal plane. Any of a wide variety of measurement techniques may be employed without departing from the spirit and scope of the instant invention.

In the illustrated embodiment, the automatic process controller 36 is a computer programmed with software to implement the functions described. However, as will be appreciated by those of ordinary skill in the art, a hardware controller (not shown) designed to implement the particular functions may also be used. Moreover, the functions of the controller described herein may be performed by one or more processing units that may or may not be geographically dispersed. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 36, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 4:
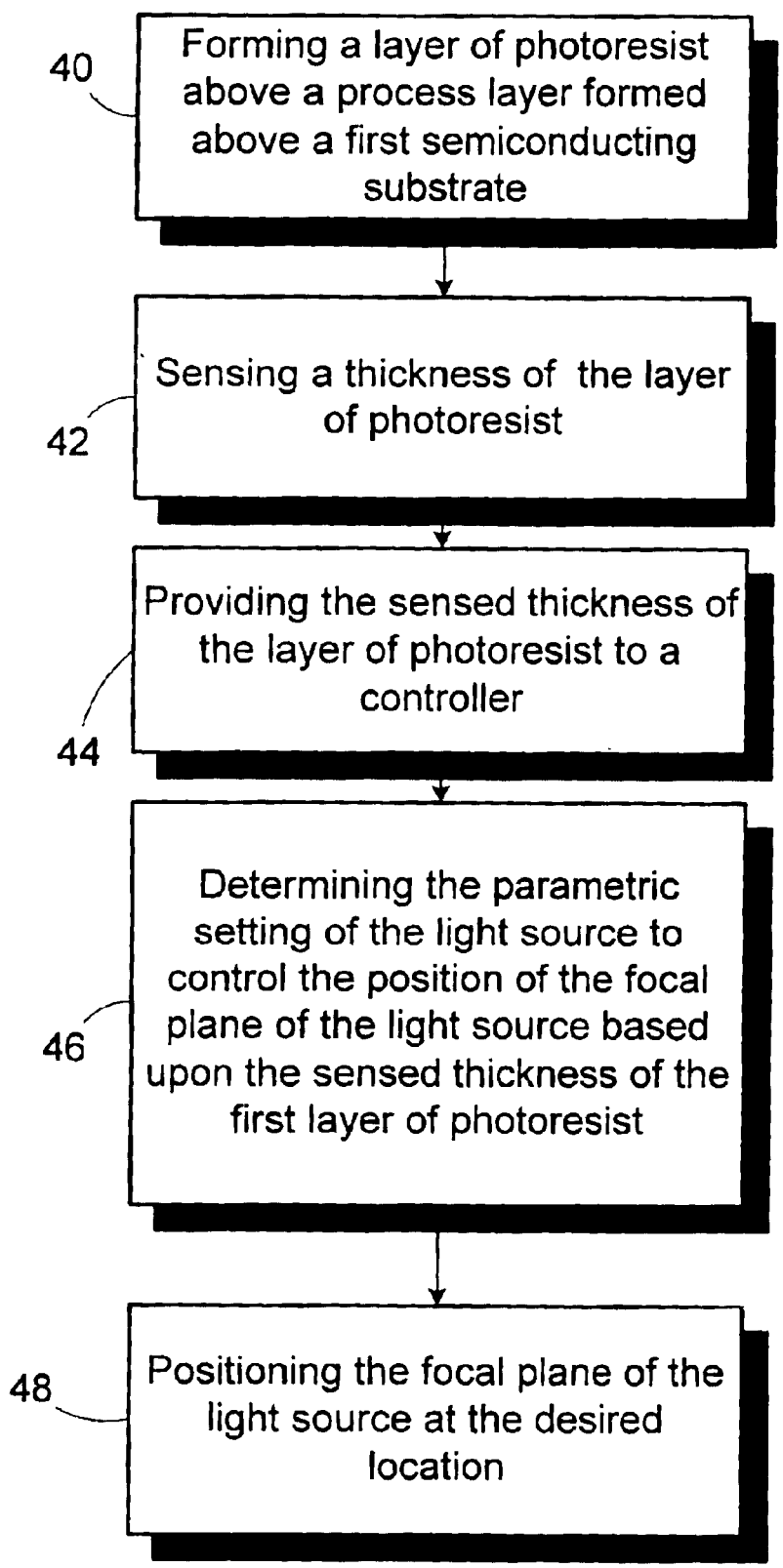
FIG. 4 depicts one illustrative embodiment of the present invention in flowchart form.

Referring to FIG. 4, an illustrative embodiment of the present invention is depicted in flowchart form. As shown therein, the present invention comprises forming the layer of photoresist 23 above the process layer 18 formed above the semiconducting substrate 10, as set forth at block 40, sensing a thickness of the layer of photoresist 23, as recited at block 42, and providing the sensed thickness of the first layer of photoresist 23 to the controller 36, as set forth at block 44. The method further comprises controlling the position of the light source relative to the wafer 10 based upon the sensed thickness of the layer of photoresist 23, as indicated at block 46.

The step of forming the layer of photoresist 23, as set forth at block 40, may be any type of process useful for forming such layers. For example, any of the spin-coating type processes described herein may be employed. Of course, the present invention should not be considered limited to those particular methods unless such methods are specifically recited in the appended claims.

Sensing the thickness of the layer of photoresist 23, as set forth at block 42, may be accomplished by any metrology tool capable of sensing or measuring such a thickness. As set forth previously, one illustrative sensor that may be used for this purpose is a K-T UV1050. Moreover, although only one such metrology tool 38 is schematically depicted in the disclosed embodiment, more than one such tool may be used if desired or deemed necessary. For example, single or multiple metrology tools 38 may be positioned to provide multiple readings of the thickness of the photoresist layer 23. In that case, the thickness described at block 42 may represent only one of the thicknesses sensed, or it may represent an average of all thicknesses sensed, etc. This sensed thickness is then provided to a controller, as described at block 44.

Next, as set forth at block 46, the present method involves determining the parametric setting of the light source to control the position of the focal plane of the light source based upon the sensed thickness of the first layer of photoresist 23. In one embodiment, the controller 36 determines the relative spacing between of the light source and the wafer 10 based on the thickness of the layer of photoresist 23. The step of determining the relative position of the light source and the wafer 10 based on the thickness of the layer of photoresist 23 may be performed by a variety of techniques. For example, a database may be developed that correlates the determined thickness of the layer of photoresist 23 to one or more corresponding parameters of the process used to position the focal plane on the wafer 10. Alternatively, one or more parameters of the process used to determine the desired position of the focal plane may be calculated based upon the determined thickness of the layer of photoresist 23. Other methodologies are also possible.

Lastly, as set forth at block 48, the present invention comprises positioning the focal plane of the light source at the desired position. The controller 36 accomplishes the positioning of the focal plane via an instruction delivered over the line 35. As discussed above, it may be desirable in some embodiments to maintain the focal plane at the desired position throughout the processing of a plurality of wafers, or even a plurality of lots of wafers. In other embodiments, however, it may be useful the determine the desired position of the focal plane for each wafer processed.

Figure 5:
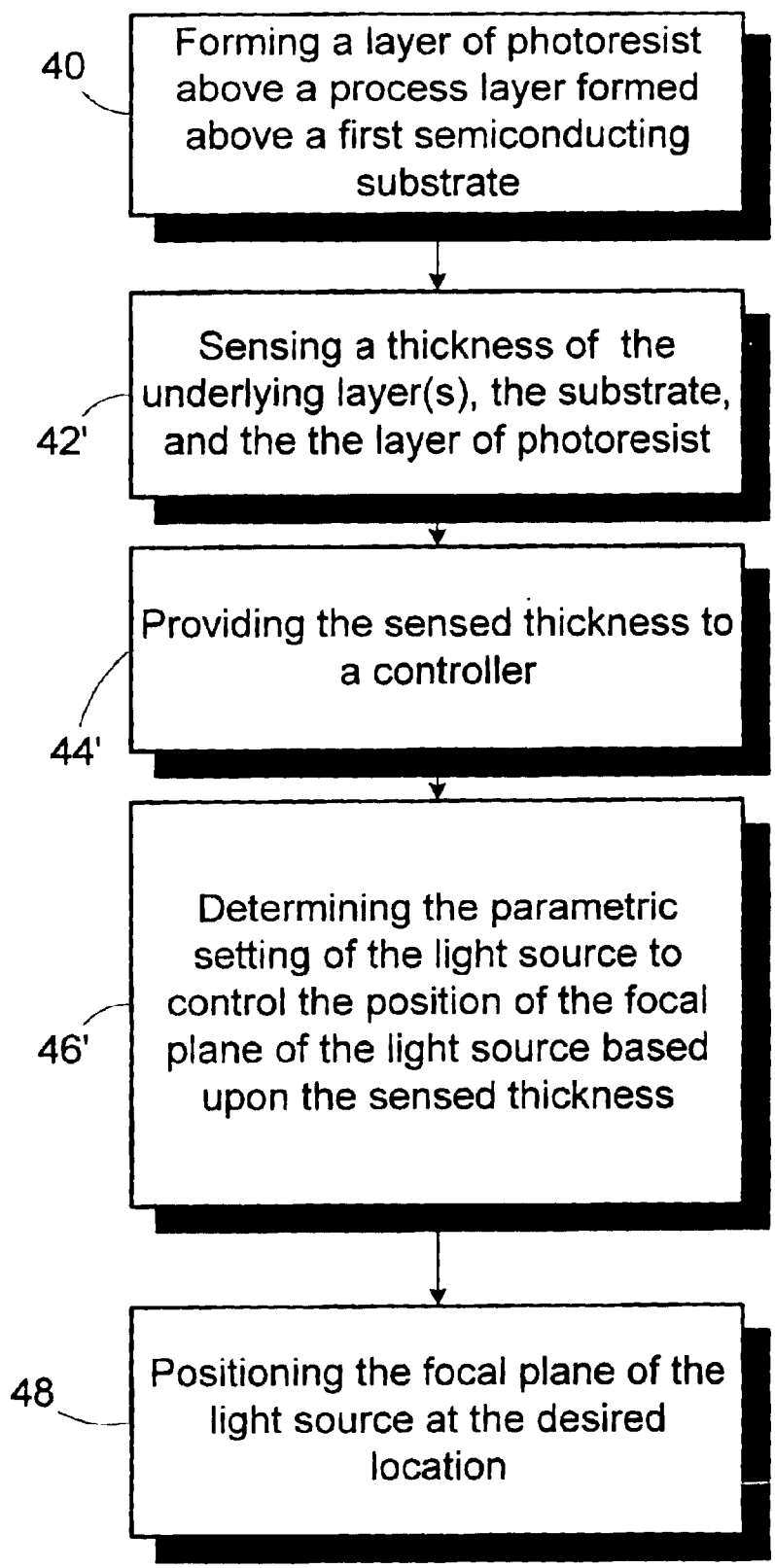
FIG. 5 depicts an alternative illustrative embodiment of the present invention in flowchart form.

In an alternative embodiment illustrated in FIG. 5, blocks 42, 44, and 46 are modified to accommodate measurements of the underlying layer(s) 18 and/or the substrate 10. For example, at block 42' of FIG. 5, the metrology tool 38 senses the thickness of the underlying layer(s) 18 and/or the thickness of the substrate 10, as well as the thickness of the layer of photoresist 23. The thickness measurements may be accomplished individually or collectively. That is, the metrology tool 38, or a plurality of metrology tools, may measure the thickness of the underlying layer(s) 18 and/or the thickness of the substrate 10, as well as the thickness of the layer of photoresist 23 individually, and then add them together to form a collective thickness. This collective thickness may then be used to identify the location of the top surface of the layer of photoresist 23. Alternatively, the metrology tool 38 may sense the overall thickness of the underlying layer(s) 18 and/or the thickness of the substrate 10, as well as the thickness of the layer of photoresist 23. In either embodiment, the intent is to arrive at a measurement that allows the stepper 39 to move the wafer 10 to a position where the focal plane of the light source is approximately coincident with the top surface of the layer of photoresist 23.

Thereafter, in alternative block 44' the controller receives the sensed thickness of the underlying layer(s) 18 and/or the thickness of the substrate 10, as well as the thickness of the layer of photoresist 23. This sensed thickness is used in alternative block 46 to determine the parametric setting of the light source.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a layer of photoresist above a process layer formed above a first semiconducting substrate;

determining a position of a top surface of said layer of photoresist;

positioning a focal plane of a light source adjacent said layer of photoresist based upon said determined position; and energizing said light source.

2. The method of claim 1, wherein determining the position of the top surface of said layer of photoresist comprises sensing a thickness of the layer of photoresist and positioning the focal plane of the light source comprises positioning the focal plane of the light source adjacent said layer of photoresist based upon said determined thickness.

3. The method of claim 2, wherein sensing the thickness of the layer of photoresist comprises determining the thickness of the layer of photoresist at one or more spaced apart locations.

4. The method of claim 2, wherein sensing the thickness of the layer of photoresist comprises determining the thickness of the layer of photoresist at a plurality of locations and averaging the determined thicknesses.

5. The method of claim 2, wherein sensing the thickness of the layer of photoresist comprises determining the thickness of the layer of photoresist at a plurality of locations and applying a least squares method to determine an approximate thicknesses of the layer of photoresist.

6. The method of claim 1, wherein positioning the focal plane of the light source adjacent said first layer of photoresist based upon said determined position comprises moving the semiconducting substrate to position the focal plane of the light source adjacent the first layer of photoresist.

7. The method of claim 1, wherein positioning the focal plane of the light source adjacent said first layer of photoresist based upon said determined position comprises moving the light source to position the focal plane of the light source adjacent the first layer of photoresist.

8. The method of claim 1, wherein determining the position of the top surface of said layer of photoresist comprises sensing a thickness of the layer of photoresist and an underlying layer, and positioning the focal plane of the light source comprises positioning the focal plane of the light source adjacent said layer of photoresist based upon said determined thickness of said layer of photoresist and the underlying layer.

9. The method of claim 8, wherein sensing the thickness of the layer of photoresist and the underlying layer comprises sensing the collective thickness of the layer of photoresist and the underlying layer.

10. The method of claim 1, wherein determining the position of the top surface of said layer of photoresist comprises sensing a thickness of the layer of photoresist, an underlying layer, and a substrate, and positioning the focal plane of the light source comprises positioning the focal plane of the light source adjacent said layer of photoresist based upon said determined thickness of said layer of photoresist, the underlying layer, and the substrate.

11. The method of claim 10, wherein sensing the thickness of the layer of photoresist, the underlying layer, and the substrate comprises sensing the collective thickness of the layer of photoresist, the underlying layer, and the substrate.

* * * * *